(12) United States Patent
Clausen et al.

(10) Patent No.: US 9,203,396 B1
(45) Date of Patent: Dec. 1, 2015

(54) RADIO FREQUENCY SWITCH DEVICE WITH SOURCE-FOLLOWER

(71) Applicant: TriQuint Semiconductor, Inc., Hillsboro, OR (US)

(72) Inventors: William J. Clausen, Altamonte Springs, FL (US); James P. Furino, Jr., Melbourne, FL (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 154 days.

(21) Appl. No.: 13/774,928

(22) Filed: Feb. 22, 2013

(51) Int. Cl.
*H04B 1/44* (2006.01)
*H03K 17/16* (2006.01)

(52) U.S. Cl.
CPC .................................... *H03K 17/161* (2013.01)

(58) Field of Classification Search
USPC ................... 455/78, 80, 82, 83, 550.1, 575.1;
333/103, 104; 327/537, 427, 434, 436
See application file for complete search history.

(56) References Cited

U.S. PATENT DOCUMENTS

| | | |
|---|---|---|
| 3,551,788 A | 12/1970 | Summer |
| 3,699,359 A | 10/1972 | Shelby |
| 4,053,916 A | 10/1977 | Cricchi et al. |
| 4,316,101 A | 2/1982 | Minner |
| 4,491,750 A | 1/1985 | Janutka |
| 5,012,123 A | 4/1991 | Ayasli et al. |
| 5,146,178 A | 9/1992 | Nojima et al. |
| 5,313,083 A | 5/1994 | Schindler |
| 5,416,043 A | 5/1995 | Burgener et al. |
| 5,492,857 A | 2/1996 | Reedy et al. |
| 5,548,239 A | 8/1996 | Kohama |
| 5,553,295 A | 9/1996 | Pantelakis et al. |
| 5,572,040 A | 11/1996 | Reedy et al. |
| 5,596,205 A | 1/1997 | Reedy et al. |
| 5,600,169 A | 2/1997 | Burgener et al. |
| 5,663,570 A | 9/1997 | Reedy et al. |
| 5,777,530 A | 7/1998 | Nakatuka |
| 5,801,577 A | 9/1998 | Tailliet |
| 5,818,099 A | 10/1998 | Burghartz |
| 5,861,336 A | 1/1999 | Reedy et al. |
| 5,863,823 A | 1/1999 | Burgener |
| 5,883,396 A | 3/1999 | Reedy et al. |
| 5,895,957 A | 4/1999 | Reedy et al. |
| 5,920,233 A | 7/1999 | Denny |
| 5,930,638 A | 7/1999 | Reedy et al. |
| 5,945,867 A | 8/1999 | Uda et al. |
| 5,973,363 A | 10/1999 | Staab et al. |

(Continued)

FOREIGN PATENT DOCUMENTS

| | | |
|---|---|---|
| CN | 1256521 | 6/2000 |
| EP | 0385641 | 9/1990 |

(Continued)

OTHER PUBLICATIONS

Final Office Action in U.S. Appl. No. 13/742,086, dated Mar. 4, 2014.

(Continued)

*Primary Examiner* — Thanh Le
(74) *Attorney, Agent, or Firm* — Withrow & Terranova, P.L.L.C.

(57) ABSTRACT

Embodiments provide a switching device including one or more cells. In embodiments, a cell may include a switch field-effect transistor (FET) and a source-follower FET, coupled between a gate and a body of the switch FET. Other embodiments may be described and claimed.

19 Claims, 5 Drawing Sheets

(56) References Cited

U.S. PATENT DOCUMENTS

| | | | |
|---|---|---|---|
| 5,973,382 A | 10/1999 | Burgener et al. | |
| 6,057,555 A | 5/2000 | Reedy et al. | |
| 6,066,993 A | 5/2000 | Yamamoto et al. | |
| 6,100,159 A | 8/2000 | Krivokapic | |
| 6,111,455 A | 8/2000 | Eleyan et al. | |
| 6,160,292 A | 12/2000 | Flaker et al. | |
| 6,173,235 B1 | 1/2001 | Maeda | |
| 6,225,667 B1 | 5/2001 | Buynoski et al. | |
| 6,229,187 B1 | 5/2001 | Ju | |
| 6,249,027 B1 | 6/2001 | Burr | |
| 6,288,613 B1* | 9/2001 | Bennett | 330/296 |
| 6,308,047 B1 | 10/2001 | Yamamoto et al. | |
| 6,376,286 B1 | 4/2002 | Ju | |
| 6,417,030 B1 | 7/2002 | Buynoski et al. | |
| 6,452,232 B1 | 9/2002 | Adan | |
| 6,503,783 B1 | 1/2003 | Mouli | |
| 6,504,212 B1 | 1/2003 | Allen et al. | |
| 6,563,366 B1 | 5/2003 | Kohama | |
| 6,631,505 B2 | 10/2003 | Arai | |
| 6,632,724 B2 | 10/2003 | Henley et al. | |
| 6,635,928 B2 | 10/2003 | Mouli | |
| RE38,319 E | 11/2003 | Lin et al. | |
| 6,642,578 B1 | 11/2003 | Arnold et al. | |
| 6,693,326 B2 | 2/2004 | Adan | |
| 6,716,682 B1 | 4/2004 | Mouli | |
| 6,785,703 B2 | 8/2004 | Bradley et al. | |
| 6,790,747 B2 | 9/2004 | Henley et al. | |
| 6,804,502 B2 | 10/2004 | Burgener et al. | |
| 6,898,778 B2 | 5/2005 | Kawanaka | |
| 6,905,918 B2 | 6/2005 | Mouli | |
| 6,908,832 B2 | 6/2005 | Farrens et al. | |
| 6,924,673 B2 | 8/2005 | Tanishima | |
| 6,930,357 B2 | 8/2005 | Kang | |
| 6,958,519 B2 | 10/2005 | Gonzalez et al. | |
| 6,969,668 B1 | 11/2005 | Kang et al. | |
| 6,978,437 B1 | 12/2005 | Rittman et al. | |
| 6,989,706 B2 | 1/2006 | Sekigawa et al. | |
| 7,056,808 B2 | 6/2006 | Henley et al. | |
| 7,057,472 B2 | 6/2006 | Fukamachi et al. | |
| 7,058,922 B2 | 6/2006 | Kawanaka | |
| 7,122,411 B2 | 10/2006 | Mouli | |
| 7,123,898 B2 | 10/2006 | Burgener et al. | |
| 7,138,846 B2 | 11/2006 | Suwa | |
| 7,158,067 B2 | 1/2007 | Lauritzen et al. | |
| 7,244,991 B2 | 7/2007 | Ohsawa | |
| 7,404,157 B2 | 7/2008 | Tanabe | |
| 7,460,852 B2 | 12/2008 | Burgener et al. | |
| 7,566,600 B2 | 7/2009 | Mouli | |
| 7,616,482 B2 | 11/2009 | Prall | |
| 7,796,969 B2 | 9/2010 | Kelly et al. | |
| 7,860,499 B2 | 12/2010 | Burgener et al. | |
| 7,863,691 B2 | 1/2011 | Wagner, Jr. et al. | |
| 7,890,891 B2 | 2/2011 | Stuber et al. | |
| 7,910,993 B2 | 3/2011 | Brindle et al. | |
| 8,129,787 B2 | 3/2012 | Brindle et al. | |
| 8,159,283 B2 | 4/2012 | Sugiyama | |
| 8,385,845 B1* | 2/2013 | Cortese | 455/83 |
| 8,395,435 B2 | 3/2013 | Cassia et al. | |
| 8,723,260 B1 | 5/2014 | Carroll et al. | |
| 8,847,672 B2* | 9/2014 | Prabhakar et al. | 327/537 |
| 8,886,136 B1* | 11/2014 | Signoff et al. | 455/78 |
| 2001/0015461 A1 | 8/2001 | Ebina | |
| 2001/0045602 A1 | 11/2001 | Maeda et al. | |
| 2002/0195623 A1 | 12/2002 | Horiuchi | |
| 2003/0002452 A1 | 1/2003 | Sahota | |
| 2003/0205760 A1 | 11/2003 | Kawanaka et al. | |
| 2004/0080364 A1 | 4/2004 | Sander et al. | |
| 2005/0167751 A1 | 8/2005 | Nakajima et al. | |
| 2006/0022733 A1* | 2/2006 | Nair | 327/437 |
| 2006/0044043 A1* | 3/2006 | Marshall | 327/427 |
| 2007/0023833 A1 | 2/2007 | Okhonin et al. | |
| 2007/0138549 A1 | 6/2007 | Wu et al. | |
| 2008/0073719 A1 | 3/2008 | Fazan et al. | |
| 2008/0076371 A1 | 3/2008 | Dribinsky et al. | |
| 2008/0303080 A1 | 12/2008 | Bhattacharyya | |
| 2009/0029511 A1 | 1/2009 | Wu | |
| 2010/0013016 A1 | 1/2010 | Shih | |
| 2011/0090022 A1 | 4/2011 | Villain | |
| 2011/0227637 A1 | 9/2011 | Stuber et al. | |
| 2011/0260774 A1 | 10/2011 | Granger-Jones et al. | |
| 2011/0285481 A1 | 11/2011 | Huang et al. | |
| 2012/0154963 A1 | 6/2012 | Deval et al. | |
| 2012/0169398 A1 | 7/2012 | Brindle et al. | |
| 2012/0267719 A1 | 10/2012 | Brindle et al. | |
| 2013/0029614 A1 | 1/2013 | Cho | |
| 2013/0100561 A1 | 4/2013 | Senouci et al. | |
| 2013/0252562 A1* | 9/2013 | Hasson et al. | 455/78 |
| 2014/0002171 A1 | 1/2014 | Nohra | |
| 2014/0009214 A1 | 1/2014 | Altunkilic | |
| 2014/0227983 A1 | 8/2014 | Clausen | |

FOREIGN PATENT DOCUMENTS

| | | |
|---|---|---|
| EP | 1006584 | 6/2000 |
| EP | 1451890 | 2/2011 |
| JP | 5575348 | 6/1980 |
| JP | 01254014 | 10/1989 |
| JP | 02161769 | 6/1990 |
| JP | 04183008 | 6/1992 |
| JP | 06334506 | 12/1994 |
| JP | 08148949 | 6/1996 |
| JP | 08307305 | 11/1996 |
| JP | 09284114 | 10/1997 |
| JP | 10242829 | 9/1998 |
| JP | 11136111 | 5/1999 |
| JP | 2003060451 | 2/2003 |
| JP | 3408762 | 5/2003 |
| JP | 2003189248 | 7/2003 |
| JP | 2004515937 | 5/2004 |
| WO | 9523460 | 8/1995 |
| WO | 0227920 | 4/2002 |
| WO | 2007008934 | 1/2007 |
| WO | 2007035610 | 3/2007 |

OTHER PUBLICATIONS

Office Action, issued in U.S. Appl. No. 13/742,086, dated Sep. 20, 2013, 9 pages.

Office Action, issued in U.S. Appl. No. 13/587,590, dated Sep. 9, 2013, 12 pages.

Assaderaghi, et al.; "Dynamic Threshold-Voltage MOSFET (DTMOS) for Ultra-Low Voltage VLSI;" IEEE. vol. 44; No. 3; 414-421; Mar. 1997.

Bolam, R. et al., "Reliability Issues for Silicon-on-Insulator," Electron Devices Meeting Technical Digest, 2000, pp. 131-134.

Burgener, et al.; "CMOS SOS Switches Offer Useful Features, High Integration;" Microwaves & RF; 107-118; Aug. 2001.

Caverly, R. et al., "A Silicon CMOS Monolithic RF and Microwave Switching Element," 27th European Microwave Conference, Sep. 1997, pp. 1046-1051.

Caverly; "Linear and Nonlinear Characteristics of the Silicon CMOS Monolithic 50-Ω Microwave and RF Control Element;" IEEE. vol. 34; No. 1; 124-126; Jan. 1999.

Celler, et al.; "Smart Cut—A guide to the technology, the process, the products;" http://www.soitec.com/pdf/SmartCut_WP.pdf; Jul. 2003.

Chao, et al.; "High-Voltage and High-Temperature Applications of DTMOS with Reverse Schottky Barrier on Substrate Conctacts;" IEEE Electron Device Letters; vol. 25; No. 2; Feb. 2004; pp. 86-88.

Chung, I. et al., "SOI MOSFET Structure with a Junction-Type Body Contact for Suppression of Pass Gate Leakage," IEEE Transactions on Electron Devices, Jul. 2001, pp. 1360-1365, vol. 48, No. 7.

Dean; "Transistors, Theory and Circuitry." McGraw-Hill Publ. Co. Ltdl; 90-93; 1964.

Drake, et al.; "Dynamic-Threshold Logic for Low-Power VLSI Design." http://www.research.ibm.com/acas/projects/01drake.pdf; 2003.

Edwards, et al.; "The Effect of Body Contact Series Resistance on SOI CMOS Amplifier Stages;" IEEE Transactions on Electron Devices; vol. 44; No. 12; Dec. 1997; pp. 2290-2294.

(56) References Cited

OTHER PUBLICATIONS

Hameau, F. et al., "Radio-Frequency Circuits Integration Using CMOS SOI 0.25μm Technology," 2002 RF IC Design Workshop Europe, Mar. 19-22, 2002, 6 pages.

Hess et al.; "Transformerless Capacitive Coupling of Gate Signals for Series Operation of Power MOS Devices;" IEEE; vol. 15; No. 5; Sep. 2000.

Hirano, Y. et al., "Impact of Actively Body-bias Controlled (ABC) SOI SRAM by using Direct Body Contact Technology for Low-Voltage Application," Electron Devices Meeting Technical Digest, 2003, pp. 2.4.1-2.4.4.

Hu, C. et al., "A Unified Gate Oxide Reliability Model," IEEE 37th Annual International Reliability Physics Symposium, 1999, pp. 47-51.

Huang et al.; "A 0.5-μm CMOS T/R Switch for 900-MHz Wireless Applications;" IEEE Journal of Solid-State Circuits; vol. 36; No. 3; Mar. 2001.

Iyama, et al.; "L-Band SPDT Switch Using Si-MOSFET;" The Institute of Electronics, Information and Communication Engineers (IEICE); 636-643; 1996.

Johnson, et al.; "Advanced Thin-Film Silicon-on-Sapphire Technology: Microwave Circuit Applications," IEEE; vol. 45; No. 5; May 1998.

Kuang, J. et al., "A floating-body charge monitoring technique for partially depleted SOI technology," Int. J. Electronics, Nov. 2004, pp. 625-637, vol. 91, No. 11.

Kuang, J. et al., "SRAM Bitline Circuits on PD SOI: Advantages and Concerns," IEEE Journal of Solid-State Circuits, Jun. 1997, pp. 837-844, vol. 32, No. 6.

Kuo, et al.; "Low-Voltage SOI CMOS VLSI Devices and Circuits;" Wiley Interscience, New York, XP001090589, pp. 57-60 and pp. 349-354; 2001.

Lauterbach, et al.; "Charge Sharing Concept and New Clocking Scheme for Power Efficiency and Electromagnetic Emission Improvement of Boosted Charge Pumps;" IEEE Journal of Solid-State Circuits; vol. 35; No. 5; pp. 719-723; May 2000.

Lee et al., "Effects of Gate Structures on the RF Performance in PD SOI MOSFETs," IEEE Microwave and Wireless Components Letters, Apr. 2005, pp. 223-225, vol. 15, No. 4.

Lee, et al.; "Effect of Body Structure on Analog Performance of SOI NMOSFETs;" Proceedings; 1998 IEEE International SOI Conference; Oct. 5-8, 1998; pp. 61-62.

Lee, H. et al., "Analysis of body bias effect with PD-SOI for analog and RF applications," Solid State Electronics, 2002, pp. 1169-1176, vol. 46.

Lee, H. et al., "Harmonic Distortion due to Narrow Width Effects in Deep sub-micron SOI-CMOS Device for analog-RF applications," 2002 IEEE International Soi Conference, Oct. 2002, pp. 83-85.

Li, et al.; "A 15-GHz Integrated CMOS Switch with 21.5-dBm IP1dB and 1.8-dB Insertion Loss;" IEEE; 2004 Symposium on VLSI Circuits; Digest of Technical Papers; Jun. 17-19, 2004.

Maeda, et al.; "Substrate-Bias Effect and Source-Drain Breakdown Characteristics in Body-Tied Short-Channel SOI MOSFET's;" IEEE Transactions on Electron Devices; vol. 46; No. 1; Jan. 1999; pp. 151-158.

Makioka, S. et al., "Super Self-Aligned GaAs RF Switch IC with 0.25 dB Extremely Low Insertion Loss for Mobile Communication Systems," IEEE Transactions on Electron Devices, Aug. 2001, pp. 1510-1514, vol. 48, No. 8.

Megahed, M. et al, "Low Cost UTSI Technology for RF Wireless Applications," IEEE MTT-S Digest, 1998, pp. 981-984.

Orndorff, et al.; "CMOS/SOS/LSI Switching Regulator Control Device;" Solid-State Circuits Conf.; Digest of Technical Papers; IEEE International; vol. XXI; pp. 234-235; Feb. 1978.

Phillips Semiconductors; "Single Pole Double Throw (SPDT) Switch, RF Communication Products;" IC17 Handbook; 1997.

Rodgers, P. et al., "Silicon UTSi CMOS RFIC for CDMA Wireless Communications Systems," IEEE MTT-S Digest, 1999, pp. 485-488.

Rozeau, O. et al., "SOI Technologies for Low-Power Low-Voltage Radio-Frequency Applications," Analog Integrated Circuits and Signal Processing, 2000, pp. 93-114, vol. 25.

Sedra, A. et al., Microelectronic Circuits, 1998, Fourth Edition, University of Toronto Press, Oxford University Press, pp. 374-375.

Sleight, J. et al., "Transient Measurements of SOI Body Contact Effectiveness," IEEE Electron Device Letters, Dec. 1998, pp. 499-501, vol. 19, No. 12.

Suehle et al., "Low Electric Field Breakdown of Thin Si02 Films Under Static and Dynamic Stress," IEEE Transactions on Electron Devices, May 1997, pp. 801-808, vol. 44, No. 5.

Tinella, et al.; "A High-Performance CMOS-SOI Antenna Switch for the 2.5 5-GHz Band;" IEEE Journal of Solid-State Circuits; vol. 38; No. 7; Jul. 2003.

Wei, et al.; "Measurement of Transient Effects in SOI DRAM/SRAM Access Transistors;" IEEE Electron Device Letters; vol. 17; No. 5; May 1996.

Workman, et al.; "A Comparative Analysis of the Dynamic Behavior of BTG/SOI MOSFET's and Circuits with Distributed Body Resistance;" IEEE Transactions on Electron Devices; vol. 45; No. 10; Oct. 1998; pp. 2138-2145.

Yamamoto, et al.; A 2.2-V Operation, 2.4-GHz Single-Chip GaAs MMIC Transceiver for Wireless Applications; IEEE; vol. 34; No. 4; Apr. 1999.

Non-Final Office Action in U.S. Appl. No. 13/772,277 dated Sep. 24, 2014.

Notice of Allowance in U.S. Appl. No. 13/587,590 dated Jan. 7, 2014.

Non-Final Office Action in U.S. Appl. No. 13/764,655 dated Dec. 4, 2014.

Notice of Allowance and Interview Summary for U.S. Appl. No. 13/742,086, mailed Jun. 24, 2014, 11 pages.

Notice of Allowance for U.S. Appl. No. 13/764,655, mailed May 8, 2015, 6 pages.

Non-Final Office Action for U.S. Appl. No. 14/172,727, mailed Aug. 27, 2015, 8 pages.

\* cited by examiner

300

Controlling switch FET to be in on state and floating a body of switch FET

304

Controlling switch FET to be in off state and providing negative bias voltage to body of switch FET

308

RADIO FREQUENCY SWITCH DEVICE WITH SOURCE-FOLLOWER

FIELD

Embodiments of the present disclosure relate generally to the field of circuits, and more particularly to a radio frequency switch device utilizing a source-follower field-effect transistor.

BACKGROUND

For silicon-on-insulator ("SOI") switch devices, a negative body bias connection is used to alleviate floating body effects during off-mode operation. Present designs require the use of a charge pump to supply the negative voltage directly to the body. The circuit elements used to employ such a design may be associated with substrate noise coupling, increased number of control lines to a decoder circuit, spurious signals entering a radio frequency ("RF") switch core (due to restriction of available routing paths), and larger die size.

BRIEF DESCRIPTION OF THE DRAWINGS

Embodiments are illustrated by way of example and not by way of limitation in the figures of the accompanying drawings, in which like references indicate similar elements.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms comprising, having, and including are synonymous, unless the context dictates otherwise.

The phrase "coupled with," along with its derivatives, may be used herein. Coupled may mean that two or more elements are in direct physical or electrical contact. However, coupled may also mean that two or more elements indirectly contact each other, but yet still cooperate or interact with each other, and may mean that one or more other elements are coupled or connected between the elements that are said to be coupled with each other.

Embodiments may include a circuit, employed in a switch device, including a switch field-effect transistor ("FET"). The switch FET may comprise a body, source, drain, and gate; each coupled with respective terminals. The switch device may be a silicon-on-insulator ("SOI") switch device. The circuit may also include a source-follower FET that is configured to provide a negative bias voltage to the body of the switch FET when the switch FET is in an off state. Various embodiments will be described in further detail below with reference to the figures.

Figure 1:
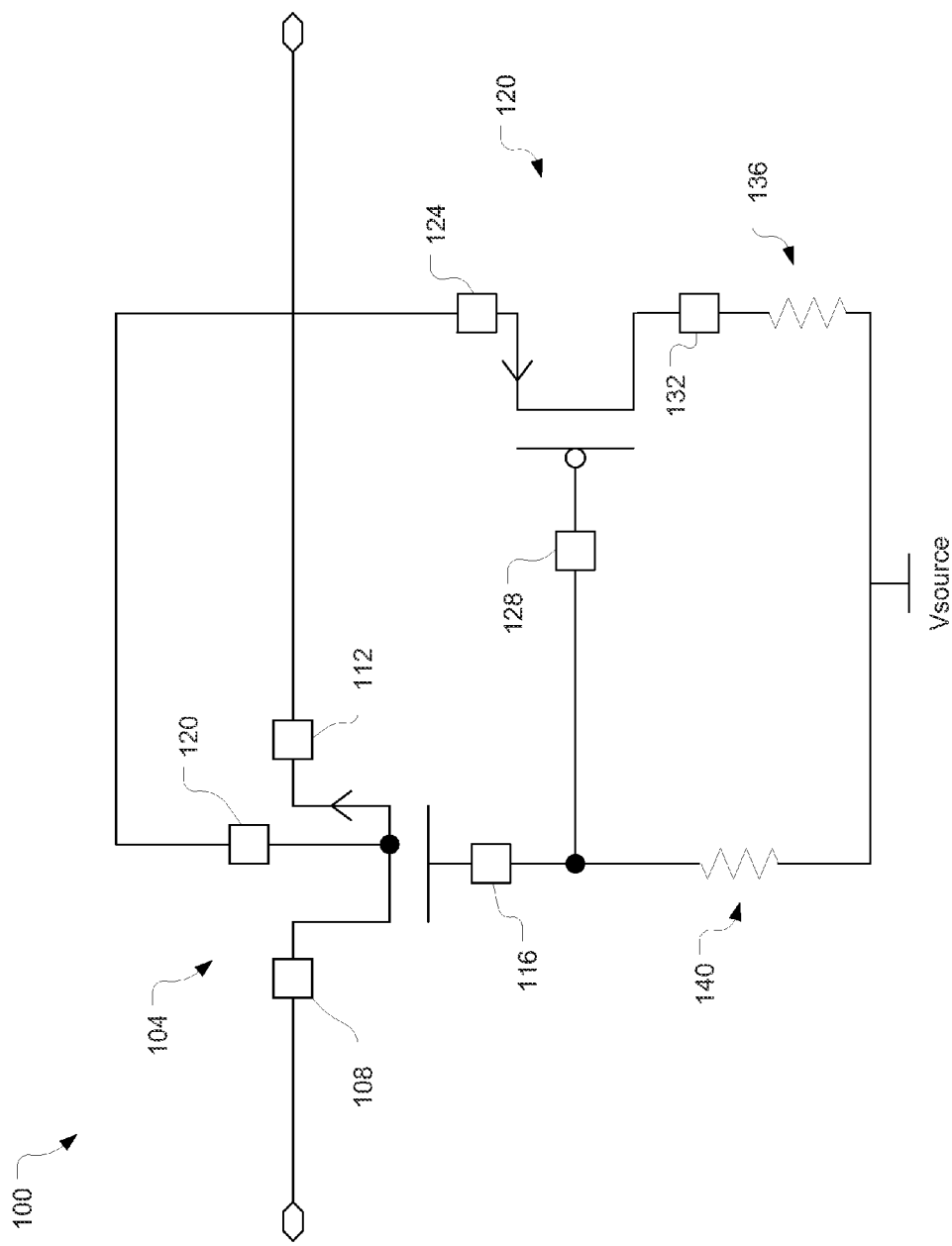
FIG. 1 illustrates a unit cell in accordance with some embodiments.

FIG. 1 illustrates a circuit 100 in accordance with various embodiments. Circuit 100 may also be referred to as a unit cell 100, or simply cell 100, of a switch device. Cell 100 may include a switch FET 104. The switch FET 104 may be, and is generally shown as, an n-channel field effect transistor ("nFET"). The switch FET 104 may include a drain terminal 108, a source terminal 112, a gate terminal 116, and a body terminal 120 respectively coupled with a drain, a source, a gate, and a body of the switch FET 104, as described below with reference to FIG. 2.

The cell 100 may further include a source-follower FET 120. The source-follower FET 120, which may also be referred to as a common-drain FET 120, may be coupled with and between the gate terminal 116 and body terminal 120 as shown. As will be understood, a first circuit element will be considered to be coupled between second and third circuit elements when an electrical path from the second to the third circuit element passes through at least a portion of the first circuit element. Thus, between as used herein, does not require, nor preclude, that the first element be placed physically between the second and third circuit elements.

The source-follower FET 120 may be, and is generally shown as, a p-channel FET ("pFET"). The source-follower FET 120 may include a source terminal 124 coupled with the body terminal 120; a gate terminal 128 coupled with gate terminal 116; and a drain terminal 132 coupled with a voltage source ("Vsource") through a resistor 136. Gate terminals 116 and 128 may be coupled with each other and further coupled with Vsource through a resistor 140.

The FETs 104 and 120 may be enhancement mode or depletion mode FETs. In some embodiments the FETs may be metal-oxide-semiconductor FETs ("MOSFETs") while in other embodiments the FETs may be referred to as an insulated-gate FETs ("IGFETs") or a metal-insulator-semiconductor FETs ("MISFETs").

Various embodiments provide a body-biasing scheme to be used in biasing the voltage of the body of the switch FET 104. The biasing scheme is discussed herein with reference to an nFET. However, in other embodiments, the biasing scheme may be used with another type of FET, such as a pFET.

In various embodiments, the switch FET 104 may selectively transition between an off state and an on state to facilitate switching of a transmission signal, hereafter referred to as a radio frequency ("RF") signal. For example, the FET 104 may pass the RF signal between the source terminal 112 and the drain terminal 108 if the switch FET 104 is in the on state, and the switch FET 104 may prevent the passage of the RF signal between the drain terminal 108 and the source terminal 112 if the switch FET 104 is in the off state.

The switch FET 104 may receive a control signal at the gate terminal 116 to transition the FET 104 between the off state and the on state. For example, the gate terminal 116 may be controlled by providing a DC, gate-to-source voltage ("$V_{GS}$") of +2.5 V. In some embodiments, the voltage may be applied to the gate terminal 116 by a decoder (not shown in FIG. 1) setting the Vsource at an appropriate level. The +2.5 V may have the effect of setting the FET 104 in the on state by causing the resistance between the drain terminal 108 and the source terminal 112 to become very low so that an RF signal can pass between the drain terminal 108 and the source terminal 112.

Figure 2:
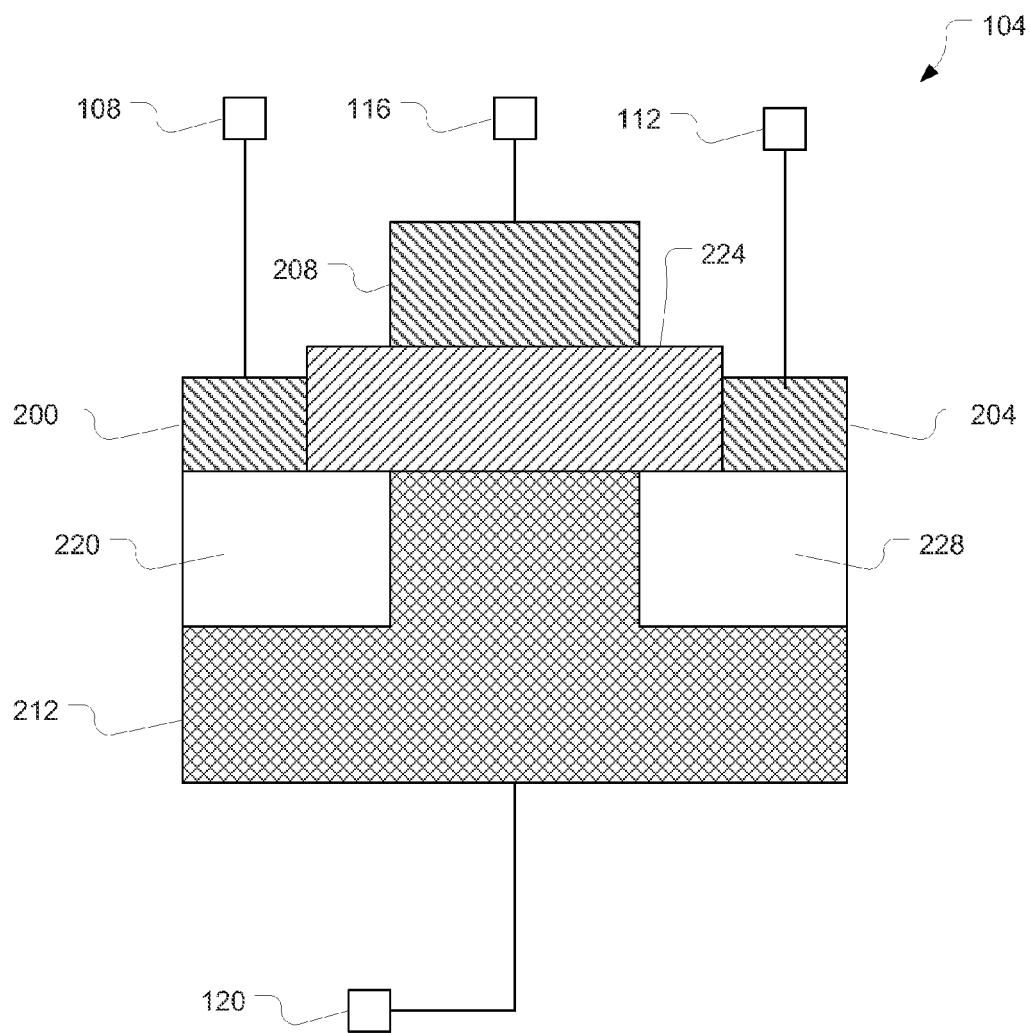
FIG. 2 illustrates a schematic of a switch transistor in accordance with some embodiments.

The application of a positive $V_{GS}$ may allow the RF signal to flow through the switch FET 104 because the switch FET 104, when included in an SOI switch device, may generally comprise parts as shown in FIG. 2. The switch FET 104 may be comprised of a drain 200 connected to the drain terminal 108, a source 204 connected to the source terminal 112, and a gate 208 connected to the gate terminal 116. In embodiments, the drain 200, the source 204, and the gate 208 may all be comprised of a metal or conductive material, for example aluminum or copper. In embodiments the drain 200, source 204, and gate 208 may be comprised of the same material, or different materials.

The switch FET 104 may further comprise a body 212 connected to the body terminal 120. The switch FET 104 may further comprise an n-type drain portion 220 positioned between the drain 200 and the body 212, and an n-type source portion 228 positioned between the source 204 and the body 212, as will be described in further detail below.

As used herein, a terminal is an element of a FET where the FET connects to another element in a circuit. In some embodiments the drain 200 and the drain terminal 108 may be considered to be the same element, for example the switch FET 104 may connect to another element in a circuit via a direct connection between the drain 200 and the element in the circuit. In other embodiments the drain terminal 108 may be a terminal, for example a metallic or otherwise conductive lead, which is electrically coupled with the drain 200. For example, in these other embodiments, the switch FET 104 may connect with another element in the circuit via the drain terminal 108, which in turn may be coupled with the drain 200. Similarly, the source 204 and source terminal 112 may be the same as one another, or electrically coupled with one another, as described above with respect to the drain 200 and drain terminal 108. Similarly the gate 208 and the gate terminal 116 may be the same as one another, or electrically coupled with one another. Finally, the body 212 and the body terminal 120 may be the same as one another or coupled with one another. As used herein, the names given to the elements are for the purpose of distinguishing one element of the switch FET 104 from another, and different embodiments may use different names, for example calling the n-type drain portion 220 the drain or the n-type source portion 228 the source of the switch FET 104.

As an example of use of the FET 104, a DC voltage will be discussed as being applied to the gate terminal 116, which in turn may cause the gate 208 to gain the specified voltage. However, in some embodiments the DC voltage may be applied directly to the gate 208. As another example, the RF signal may be received at either the source 204 or the source terminal 112 (or the drain 200 or the drain terminal 108), and passed through the switch FET 104 when the switch FET 104 is in an on state, to the drain 200 or drain terminal 108 (or the source 204 or the source terminal 112).

The body 212 may be made up of a p-type material, for example a Group IV element such as silicon or germanium doped with Group III elements such as boron or aluminum. The n-type drain and source portions 220, 228, may be comprised of a Group IV element such as silicon or germanium doped with a Group V element such as arsenic or phosphorous. The n-type drain and source portions 220, 228 may be separated from one another by the body 212. In general, a p-type material is lacking electrons and is said to have electron holes. An n-type material has extra electrons that may be able to move as an electric current within or out of the n-type material, and may therefore be said to have mobile electrons.

As noted above, the gate 208 of the switch FET 104 may be comprised of a conductive metal such as copper or aluminum. In other embodiments, the gate 208 may be comprised of tantalum, tungsten or tantalum nitride. In other embodiments, the gate 208 of the switch FET 104 may be comprised of a polysilicon material. The drain 200, source 204, gate 208, and body 212 may all be separated from one another by a dielectric 224, for example silicon dioxide, silicon oxynitride, or some other high-k dielectric that prevents the flow of electrons between the drain 200 and the source 204.

To switch the FET 104 to the on state, an electrostatic field may be created between the gate 208 and the rest of the switch FET 104. This may be done by the decoder setting Vsource to provide, for example, +2.5 V at the gate terminal 116. The drain 200 and source 204 may have a DC-bias voltage of, for example, 0 V. This may result in a positive $V_{GS}$ of, for example, 2.5 V. When +2.5 V is provided to the gate terminal 128, the source-follower 120 may be operating in a high-impedance state. This may regulate the forward voltage of the body 212 of the switch FET 104 by limiting the current to the body as the body diode forward biases keeping the body voltage limited to under 500 mV, for example.

The positive $V_{GS}$ may repel the electron holes in the p-type material of the body 212 while attracting the free electrons in the p-type material of the body 212. At the same time, the positive $V_{GS}$ may attract the mobile electrons in the n-type drain and source portions 220, 228. When the positive voltage of the gate 208 becomes high enough compared to the DC voltage of the drain 200 and the source 204, a voltage known as a threshold voltage, the repulsion in the p-type material of the body 212, and the attraction of the free electrons in the body 212 and the mobile electrons in the n-type drain and source portions 220, 228, may create an electric channel. The electric channel is sometimes called an inversion layer, and may be between the n-type drain and source portions 220, 228 and directly under the dielectric 224. In other words, the electric channel between the n-type drain and source portions 220, 228 may be directly between the body 212 and the dielectric 224. In some embodiments, increasing the voltage applied to the gate 208 may increase the size of the electrostatic field. The increase in the electrostatic field may increase the size of the electric channel, and thus the amount of current that can be passed between the drain 200 and the source 204.

To switch the switch FET 104 to the off state, the decoder may set the Vsource in a manner such a voltage of, for example, −2.5 V is applied to the gate 208. The drain 200 and source 204 may remain DC biased at 0 V. When a negative voltage is provided to the gate terminal 128, the source-follower 120 will be turned on, thereby providing a low impedance between the source terminal 124 and the drain terminal 132. This will result in the negative voltage at the gate terminal 128 being transferred to the body. Thus, a negative bias voltage of, for example, −2.5 V, may be applied to the body 212. The negative $V_{GS}$ voltage in conjunction with the negative source-to-body voltage ("$V_{SB}$") may create a negative electrostatic field that provides a high resistance between the drain terminal 108 and the source terminal 112. This is due to the negative electrostatic field simultaneously attracting the electron holes in the p-type body 212 and repelling the mobile electrons in the n-type drain and source portions 220, 228, thereby inhibiting transfer of electrons between the source 204 and the drain 200. In other embodiments where a pFET is used instead of an nFET, the body 212 may be an n-type material and the drain and source portions 220, 228 may be p-type material.

Utilizing the source-follower FET 120 in the manner shown may provide a number of advantages in controlling the cell 100. For example, decoder circuitry may only need one line for the gate and the body. Thereby simplifying power management and decoder functionality for switch operation. Further, the forward voltage applied to the body of the switch FET 104 when the switch FET 104 is in an on state may work to improve on-state resistance and linearity. Furthermore, the high impedance of the source-follower FET 120 that occurs when the switch FET is in the on state may keep the parasitic, lateral N-P-N junction of the switch FET 104 from forward biasing. This may provide a significant performance increase in on-state harmonics and intermodulation distortion ("IMD").

Figure 3:
FIG. 3 illustrates a flow chart of a method of operation in accordance with some embodiments.

FIG. 3 shows a flowchart of a method 300 of operating a unit cell, for example, cell 100, in accordance with some embodiments.

At block 304, the method 300 may include controlling a switch FET to be in an on state. This may be done, for example, by a decoder providing a positive gate-to-source voltage on the switch FET. The method 300 may further include, at block 704, forward biasing a body of the switch FET, which may result in a body voltage that is approximately 400 mV. Forward bias limiting the body of the switch FET may be done by a source-follower FET coupled between a gate and a body of the switch FET, as shown and described with respect to FIG. 1.

At block 308, the method 300 may include controlling switch FET to be in an off state. This may be done, for example, by the decoder providing a negative gate-to-source voltage on the switch FET. The method 300 may further include, at block 308, biasing the body of the switch FET to a negative voltage. As described above, this may be done by the source-follower FET providing a low impedance between its source and drain and transferring the negative voltage at its gate to the body of the switch FET.

Figure 4:
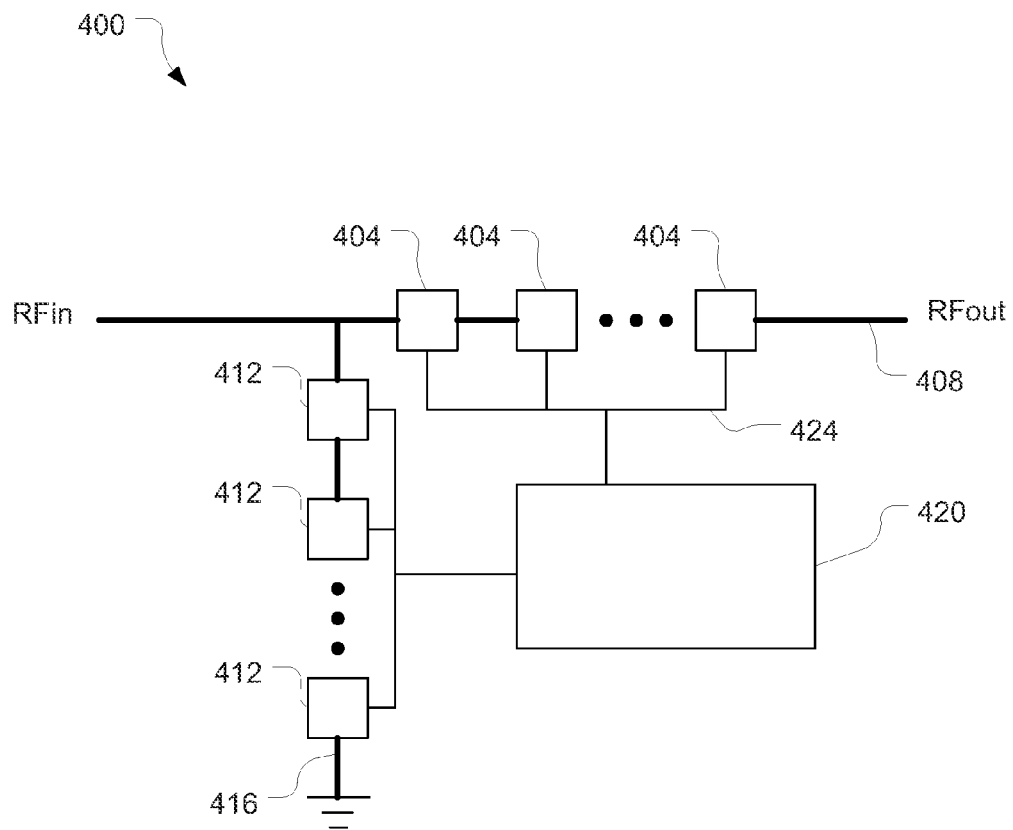
FIG. 4 illustrates a switch device in accordance with some embodiments.

FIG. 4 depicts an example of a switch device 400 in accordance with some embodiments. The switch device 400 may include a plurality of series cells 404 coupled in series with one another on a series line 408. The switch device 400 may further include a plurality of shunt cells 412 coupled in series with one another on a shunt line 416. It may be desirable to couple many cells in series as shown due to the large resistance created between the source terminal and the drain terminal when the switch FET is in the off state. If the current of the RF signal is very large, then the switch FET may be damaged. By coupling a plurality of FETs in series, the load created by the large RF signal may be distributed so that each FET is only bearing a portion of the load. In this manner, the lifetime of the FETs may be extended. Individual cells of the switch device 400 may be similar to cell 100.

The switch device 400 may further include a decoder 420. The decoder 420 may be coupled with the cells through decoder lines 424 (shown with lighter line-weight than the series line 408 and shunt line 416). In particular, a decoder line 424 may be provided to gate terminals of FETs of each cell. Given the configuration of the switch and source-follower FETs described above, the cells do not need a separate decoder line for the gate and body of the switch FETs. This reduction of control lines may result in a smaller die size, less substrate noise coupling, and a decrease in spurious signals entering an RF switch core from any on-die charge pump circuitry.

When the switch device 400 is in an on state, to pass the RF signal from an input to an output, the decoder 420 may set each of the series cells 404 to an on state and may set each of the shunt cells 412 to an off state. When the switch device 400 is in an off state, to prevent passage of the RF signal from the input to the output, the decoder 420 may set each of the series cells 404 to an off state and may set each of the shunt cells 412 to an on state.

Figure 5:
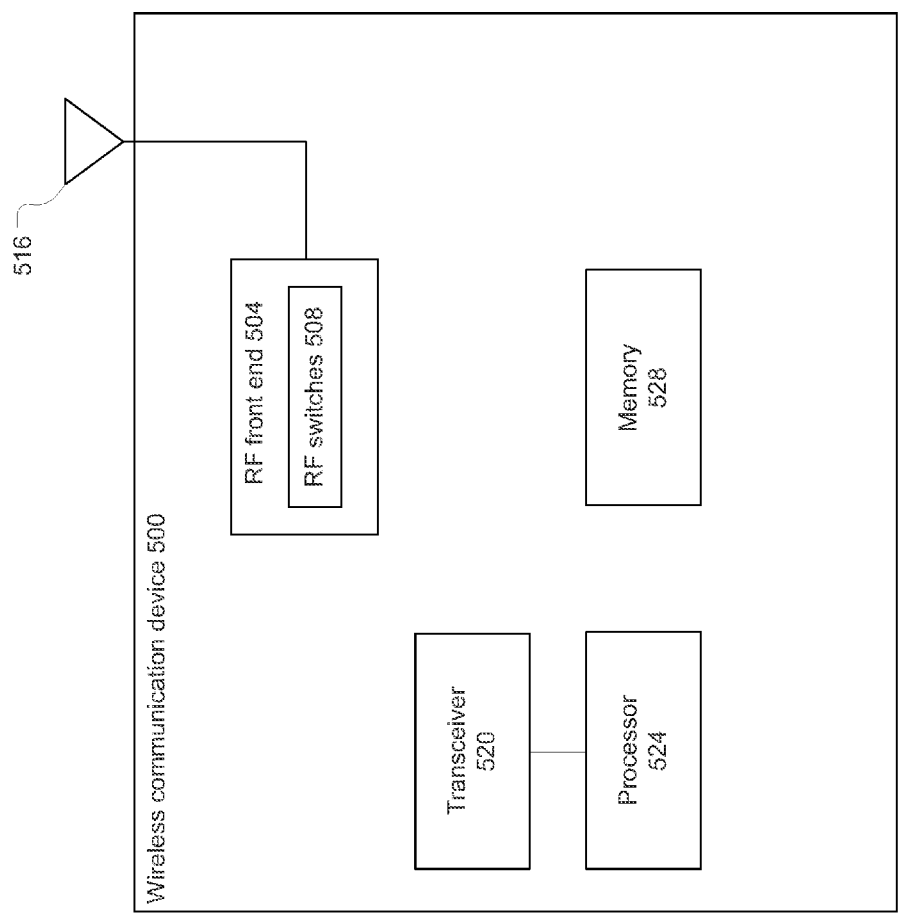
FIG. 5 illustrates a wireless communication device in accordance with some embodiments.

A wireless communication device 500 is illustrated in FIG. 5 in accordance with some embodiments. Wireless communication device 500 may have an RF front end 504 to provide various front-end functionality. The RF front end 504 may include one or more RF switches 508 to selectively pass RF signal(s) to/from, or within components of the wireless communication device 500. The RF switches 508 may be similar to and substantially interchangeable with switch device 400. The RF switches 508 may be deployed in various elements of the RF front end 504 such as, but not limited to, an antenna switch module, a distribution switch, a transmitter, a receiver, etc. The RF front end 504 may also include other elements not specifically shown or discussed such as, but not limited to, amplifiers, converters, filters, etc.

In addition to the RF front end 504, the wireless communication device 500 may have an antenna structure 516, a transceiver 520, a processor 524, and a memory 528 coupled with each other at least as shown.

The processor 524 may execute a basic operating system program, stored in the memory 528, in order to control the overall operation of the wireless communication device 500. For example, the main processor 524 may control the reception of signals and the transmission of signals by transceiver 520. The main processor 524 may be capable of executing other processes and programs resident in the memory 528 and may move data into or out of memory 528, as desired by an executing process.

The transceiver 520 may receive outgoing data (e.g., voice data, web data, e-mail, signaling data, etc.) from the processor 524, may generate RF signal(s) to represent the outgoing data, and provide the $RF_{in}$ signal(s) to the RF front end 504. Conversely, the transceiver 520 may receive RF signals from the RF front end 504 that represent incoming data. The transceiver 520 may process the RF signals and send incoming signals to the processor 524 for further processing.

In various embodiments, the wireless communication device 500 may be, but is not limited to, a mobile telephone, a paging device, a personal digital assistant, a text-messaging device, a portable computer, a desktop computer, a base station, a subscriber station, an access point, a radar, a satellite communication device, or any other device capable of wirelessly transmitting/receiving RF signals.

Those skilled in the art will recognize that the wireless communication device 500 is given by way of example and that, for simplicity and clarity, only so much of the construction and operation of the wireless communication device 500 as is necessary for an understanding of the embodiments is shown and described. Various embodiments contemplate any suitable component or combination of components performing any suitable tasks in association with wireless communication device 500, according to particular needs. Moreover, it is understood that the wireless communication device 500 should not be construed to limit the types of devices in which embodiments may be implemented.

Various embodiments describe a circuit, for example, a SOI circuit, configured to switch an RF signal. The circuit may comprise a switch FET including a source terminal, a gate terminal, a drain terminal, and a body terminal; and a source-follower FET coupled with and between the gate terminal and the body terminal, the source-follower FET configured to provide a negative bias voltage to the body terminal when the switch FET is off.

The source-follower FET may include: a source terminal coupled with the body terminal of the switch FET; a gate terminal coupled with the gate terminal of the switch FET; and a drain terminal coupled with a voltage source.

The drain terminal of the source-follower FET may be coupled with the voltage source through a first resistor. The gate terminals of the switch FET and the source-follower FET may be further coupled with the voltage source through a second resistor.

In some embodiments, the source-follower FET is further configured to allow the body terminal to forward bias limit when the switch FET is on.

The source-follower FET may be configured to provide a low impedance when the switch FET is off to provide the negative bias voltage to the body terminal.

The source-follower FET may be configured to provide a high impedance to the body terminal when the switch FET is on.

In some embodiments, the circuit may further comprise a plurality of FETs, including the switch FET, coupled in series with one another.

The switch FET may be an n-channel FET and the source-follower FET may be a p-channel FET.

Some embodiments describe a wireless communication device comprising: a transceiver; an antenna; and an RF front-end coupled with the transceiver and the antenna and configured to communicate signals between the transceiver and the antenna, the radio frequency front-end including an SOI switch device. The SOI switch device may include a decoder configured to set individual switch field-effect transistors ("FETs") in an off state or an on state; and a cell with a switch field-effect transistor ("FET") of the plurality of switch FETs and a source-follower FET, wherein the source-follower FET is coupled with and between a gate and a body of the switch FET and is configured to provide a negative body bias voltage to the body when the switch FET is in an off-state.

The source-follower FET may include a source coupled with the body of the switch FET; a gate coupled with the gate of the switch FET; and a drain coupled with the decoder. The drain of the source-follower FET may be coupled with the decoder through a first resistor; and the gates of the switch FET and the source-follower FET may be further coupled with the decoder through a second resistor.

The switch FET may be an n-channel FET and the source-follower FET may be a p-channel FET.

Some embodiments describe a method comprising: controlling, with a decoder circuit, a switch field-effect transistor ("FET") to be in an off state; providing, with a source-follower FET coupled between a gate and body of the switch FET, a negative bias voltage to the body while the switch FET is in the off state.

The method may further include controlling, with the decoder circuit, the switch FET to be in an on state by providing a positive voltage at the gate of the switch FET; and limiting forward biasing, with the source-follower FET, the body of the switch FET while the switch FET is in the on state.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A circuit configured to switch a radio-frequency ("RF") signal, the circuit comprising:
   a switch field-effect transistor ("FET") including a source terminal, a gate terminal, a drain terminal, and a body terminal; and
   a source-follower FET coupled with and between the gate terminal and the body terminal, the source-follower FET configured to provide a negative bias voltage to the body terminal when the switch FET is off.

2. The circuit of claim 1, wherein the source-follower FET includes:
   a source terminal coupled with the body terminal of the switch FET;
   a gate terminal coupled with the gate terminal of the switch FET; and
   a drain terminal coupled with a voltage source.

3. The circuit of claim 2, wherein the drain terminal of the source-follower FET is coupled with the voltage source through a first resistor.

4. The circuit of claim 3, wherein the gate terminals of the switch FET and the source-follower FET are further coupled with the voltage source through a second resistor.

5. The circuit of claim 1, wherein the source-follower FET is further configured to allow the body terminal to forward bias limit when the switch FET is on.

6. The circuit of claim 1, wherein the source-follower FET is configured to provide a low impedance when the switch FET is off to provide the negative bias voltage to the body terminal.

7. The circuit of claim 1, wherein the source-follower FET is configured to provide a high impedance to the body terminal when the switch FET is on.

8. The circuit of claim 1, further comprising:
   a plurality of FETs, including the switch FET, coupled in series with one another.

9. The circuit of claim 1, wherein the switch FET is an n-channel FET and the source-follower FET is a p-channel FET.

10. The circuit of claim 1, wherein the circuit comprises a silicon-on-insulator ("SOI") circuit.

11. A wireless communication device comprising:
   a transceiver;
   an antenna; and
   a radio frequency ("RF") front-end coupled with the transceiver and the antenna and configured to communicate signals between the transceiver and the antenna, the radio frequency front-end including a silicon-on-insulator switch device that has:
      a decoder configured to set individual switch field-effect transistors ("FETs") in an off state or an on state; and
      a cell with a switch field-effect transistor ("FET") of the plurality of switch FETs and a source-follower FET, wherein the source-follower FET is coupled with and between a gate and a body of the switch FET of the cell and is configured to provide a negative body bias voltage to the body when the switch FET of the cell is in an off-state.

12. The wireless communication device of claim 11, wherein the source-follower FET includes:
   a source coupled with the body of the switch FET;

a gate coupled with the gate of the switch FET; and a drain coupled with the decoder.

13. The wireless communication device of claim 12, wherein the drain of the source-follower FET is coupled with the decoder through a first resistor.

14. The wireless communication device of claim 13, wherein the gates of the switch FET and the source-follower FET are further coupled with the decoder through a second resistor.

15. The wireless communication device of claim 11, wherein the switch FET is an n-channel FET and the source-follower FET is a p-channel FET.

16. The wireless communication device of claim 11, wherein switching device comprises a silicon-on-insulator ("SOI") circuit.

17. A method comprising:
   controlling, with a decoder circuit, a switch field-effect transistor ("FET") to be in an off state; and
   providing, with a source-follower FET coupled between a gate and body of the switch FET, a negative bias voltage to the body while the switch FET is in the off state.

18. The method of claim 17, wherein the source-follower FET is a p-channel FET and the switch FET is an n-channel FET.

19. The method of claim 17, further comprising:
   controlling, with the decoder circuit, the switch FET to be in an on state by providing a positive voltage at the gate of the switch FET; and
   limiting forward biasing, with the source-follower FET, the body of the switch FET while the switch FET is in the on state.

* * * * *